(12) United States Patent
Lin et al.

(10) Patent No.: US 12,262,555 B2
(45) Date of Patent: Mar. 25, 2025

(54) SEMICONDUCTOR DEVICE AND METHOD OF FABRICATING THE SAME

(71) Applicant: United Microelectronics Corp., Hsinchu (TW)

(72) Inventors: Jia-He Lin, New Taipei (TW); Yu-Ruei Chen, New Taipei (TW); Yu-Hsiang Lin, New Taipei (TW)

(73) Assignee: United Microelectronics Corp., Hsinchu (TW)

( * ) Notice: Subject to any disclaimer, the term of this patent is extended or adjusted under 35 U.S.C. 154(b) by 433 days.

(21) Appl. No.: 17/746,964

(22) Filed: May 18, 2022

(65) Prior Publication Data

US 2023/0326997 A1 Oct. 12, 2023

(30) Foreign Application Priority Data

Apr. 8, 2022 (TW) .................................. 111113532

(51) Int. Cl.
*H10D 64/01* (2025.01)
*H10D 30/01* (2025.01)
*H10D 30/62* (2025.01)
*H10D 62/10* (2025.01)

(52) U.S. Cl.
CPC ......... *H10D 64/017* (2025.01); *H10D 30/024* (2025.01); *H10D 30/6211* (2025.01); *H10D 62/106* (2025.01)

(58) Field of Classification Search
None
See application file for complete search history.

(56) References Cited

U.S. PATENT DOCUMENTS

| | | | |
|---|---|---|---|
| 6,849,947 B2 | 2/2005 | Hino et al. | |
| 8,125,051 B2 | 2/2012 | Chuang et al. | |
| 8,486,587 B2 | 7/2013 | Tsai et al. | |
| 8,530,326 B2 | 9/2013 | Lai et al. | |
| 8,735,994 B2 | 5/2014 | Liu et al. | |
| 8,975,129 B1 * | 3/2015 | Shieh ................ H01L 21/76224 | |
| | | | 438/421 |
| 9,034,723 B1 * | 5/2015 | Shieh ................... H10D 86/011 | |
| | | | 438/424 |
| 9,275,933 B2 | 3/2016 | Kuo et al. | |
| 9,748,139 B1 | 8/2017 | Liou et al. | |
| 9,761,657 B2 | 9/2017 | Hsiao et al. | |
| 9,761,791 B2 | 9/2017 | Shiu et al. | |
| 10,068,900 B1 | 9/2018 | Yang et al. | |
| 10,090,465 B2 | 10/2018 | Hsu et al. | |

(Continued)

Primary Examiner — Nicholas J Tobergte
(74) Attorney, Agent, or Firm — JCIPRNET

(57) ABSTRACT

A semiconductor device includes a substrate, a plurality of planar transistors, a fin-type field effect transistor and a first nonactive structure. The substrate includes a first region and a second region. The first region includes a plurality of first planar active regions and a nonactive region. The nonactive region is located between or aside the plurality of first planar active regions and includes a second planar active region. The second region has a fin active region. The plurality of planar transistors are located in the plurality of first planar active regions within the first region. The fin-type field effect transistor is located on the fin active region within the second region. The first nonactive structure is located in the nonactive region between the plurality of planar transistors.

17 Claims, 13 Drawing Sheets

(56) References Cited

U.S. PATENT DOCUMENTS

| | | | |
|---|---|---|---|
| 2013/0134520 A1* | 5/2013 | Maeda | H10D 84/038 |
| | | | 257/E27.06 |
| 2016/0043222 A1* | 2/2016 | Cho | H10D 30/794 |
| | | | 257/369 |
| 2017/0103981 A1* | 4/2017 | Hung | H10D 1/00 |
| 2020/0152461 A1* | 5/2020 | Kim | H01L 21/823412 |
| 2021/0296312 A1* | 9/2021 | Chou | H10D 84/834 |

* cited by examiner

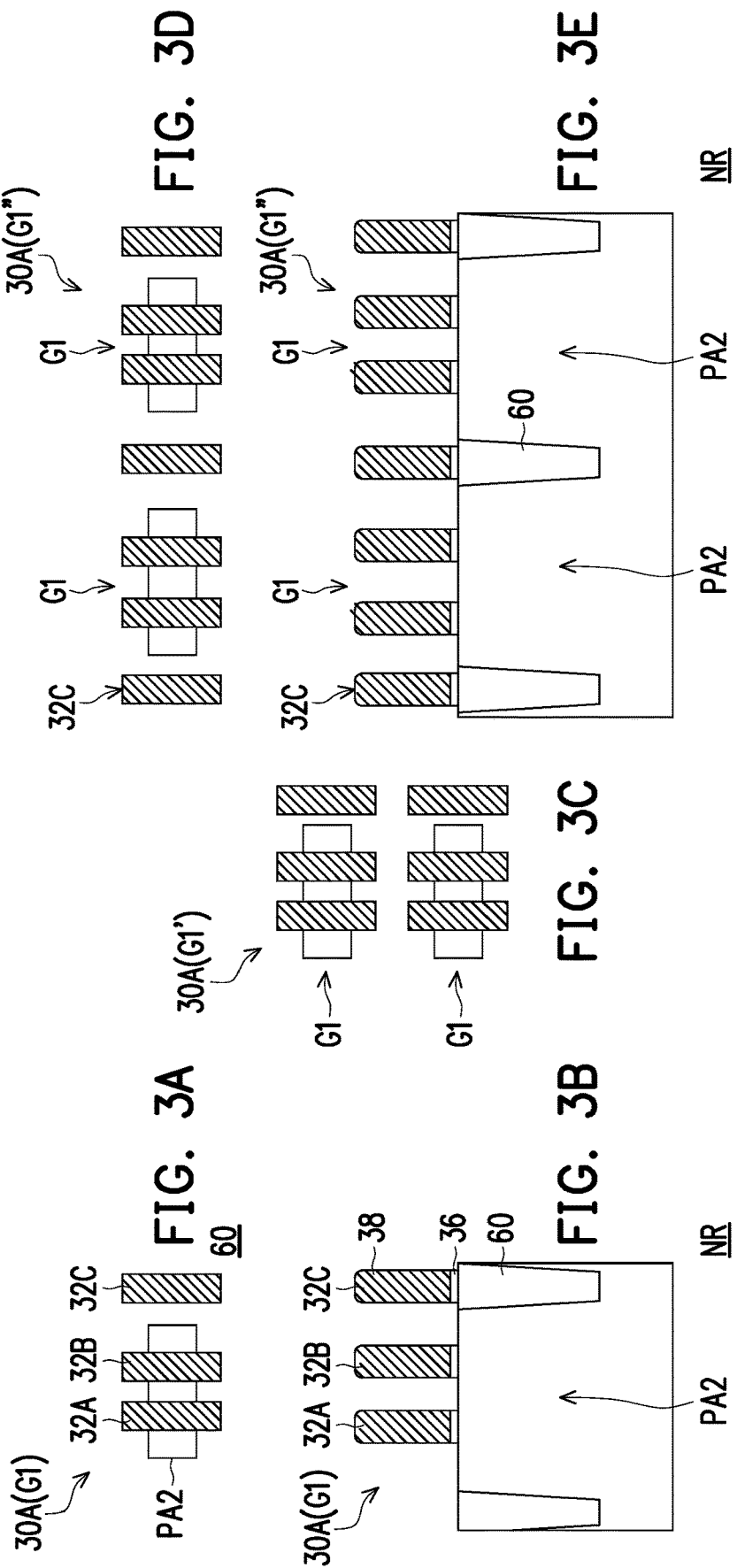

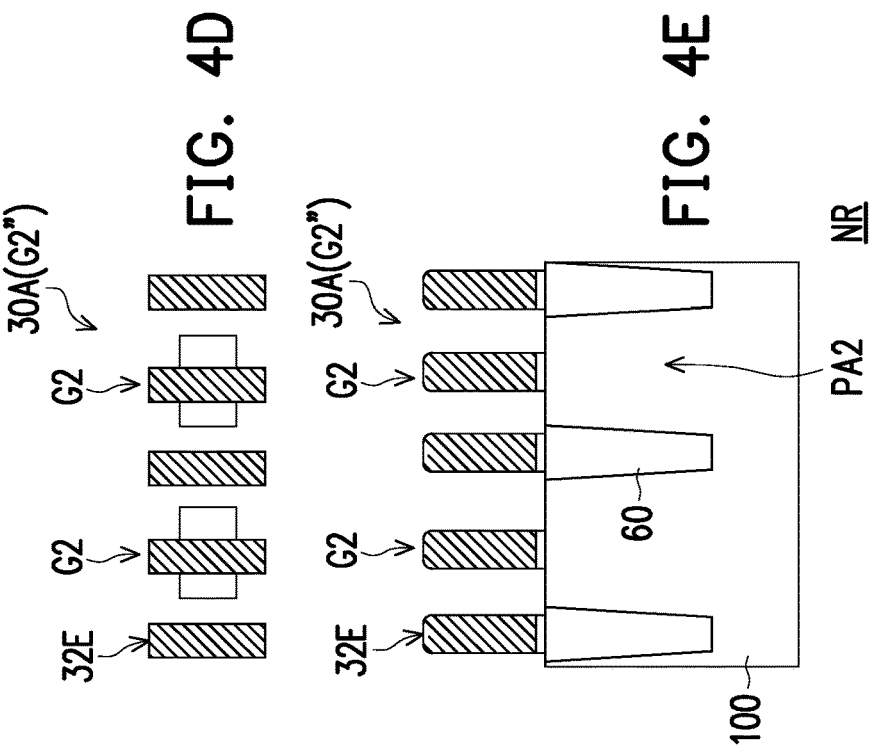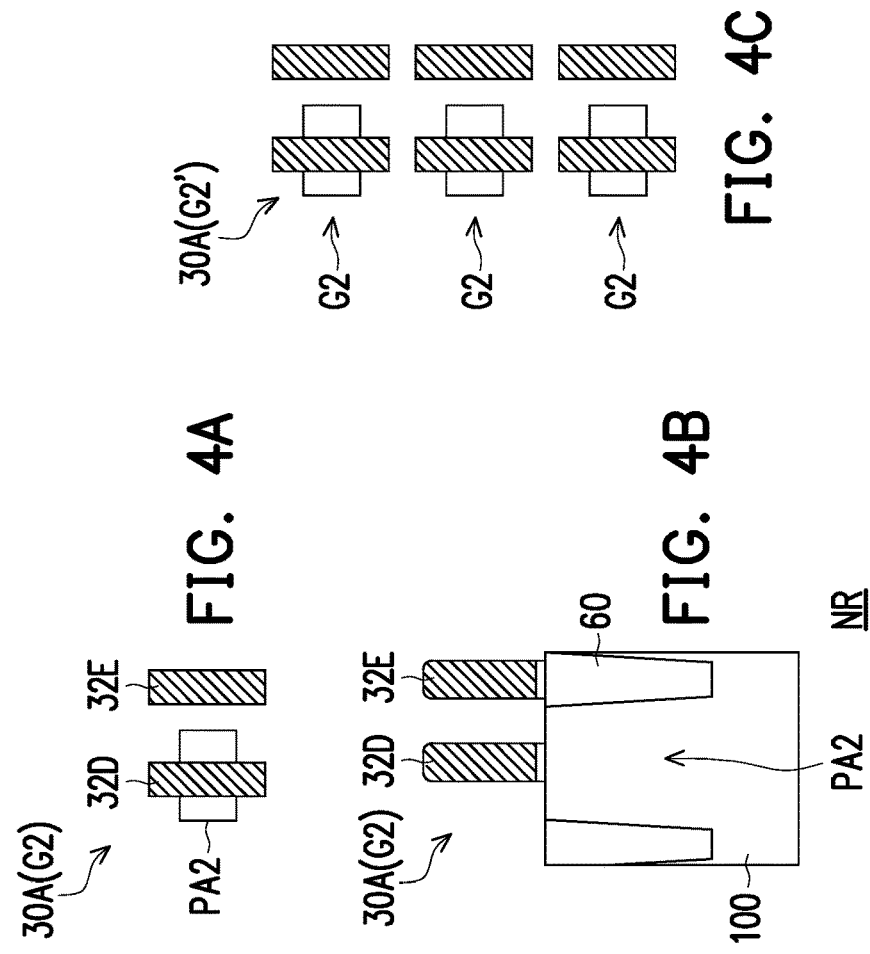

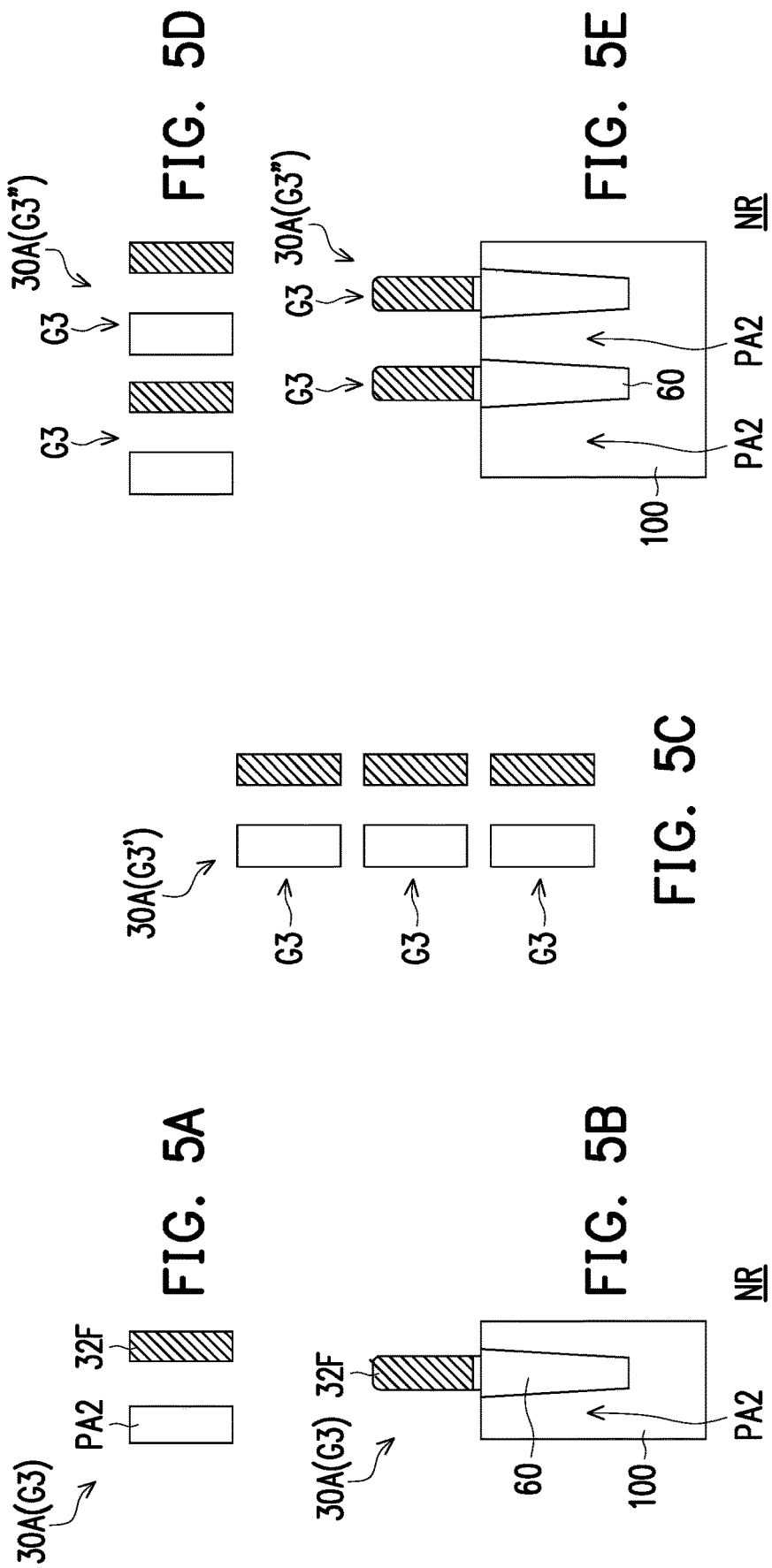

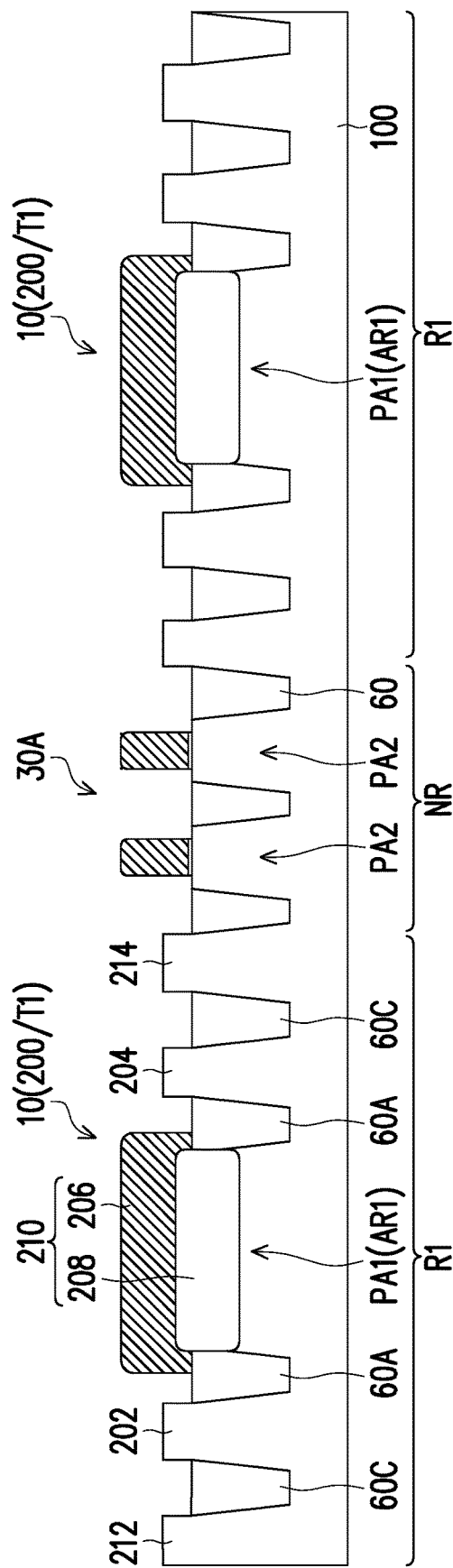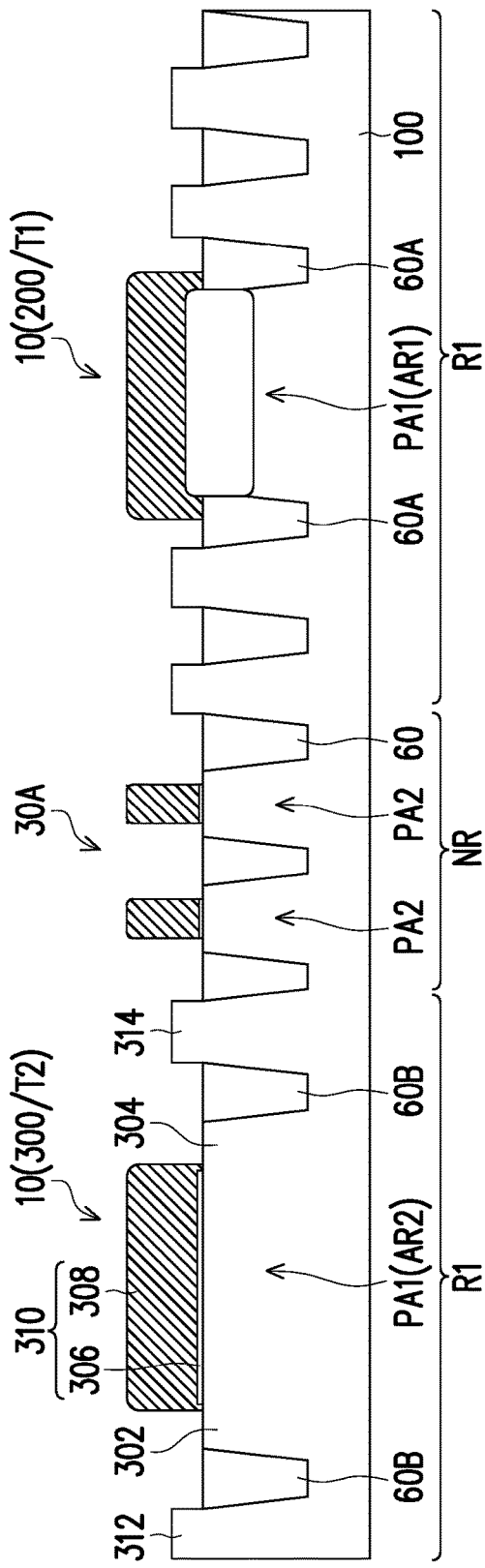

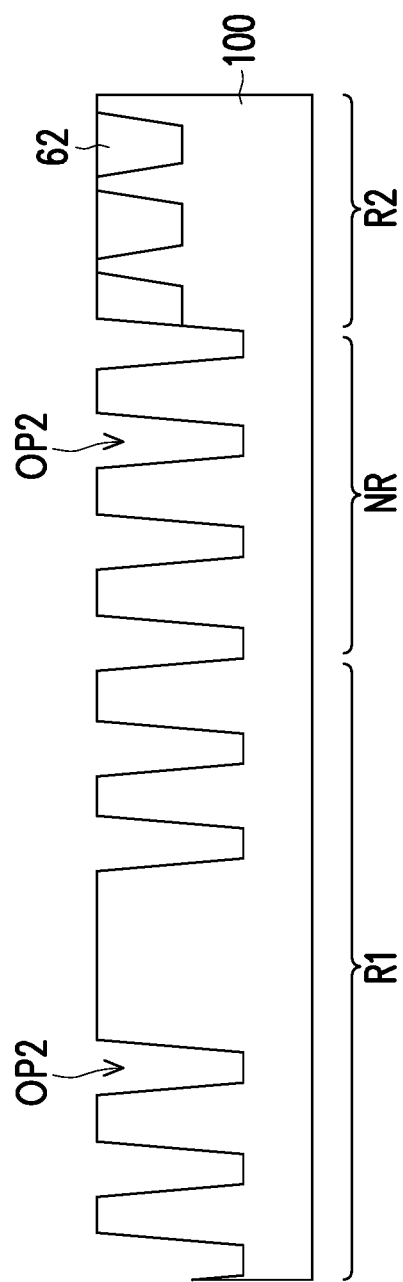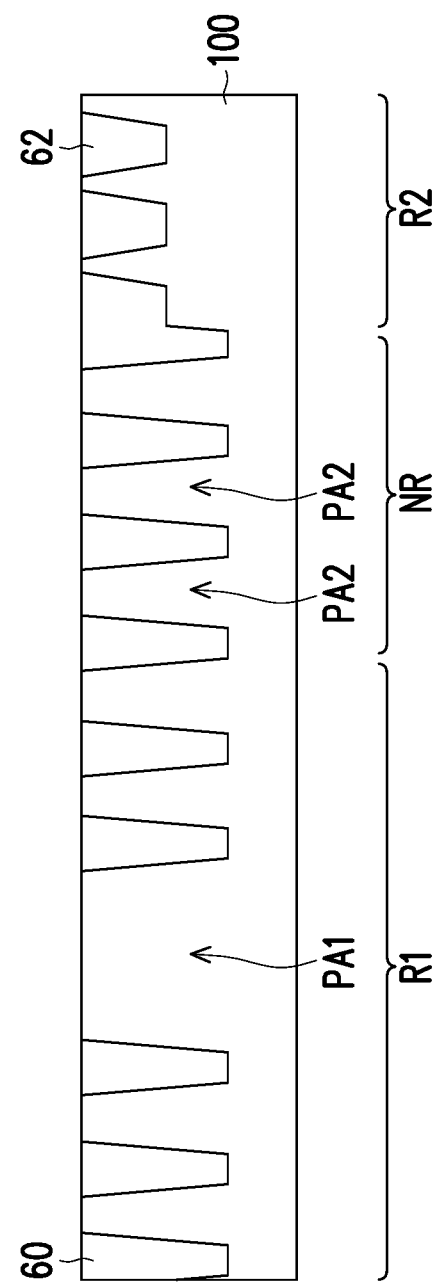

SEMICONDUCTOR DEVICE AND METHOD OF FABRICATING THE SAME

CROSS-REFERENCE TO RELATED APPLICATION

This application claims the priority benefit of Taiwan application serial no. 111113532, filed on Apr. 8, 2022. The entirety of the above-mentioned patent application is hereby incorporated by reference herein and made a part of this specification.

BACKGROUND

Technical Field

The present disclosure relates to an integrated circuit and a method of fabricating the same, and more particularly, to a semiconductor device and a method of fabricating the same.

Description of Related Art

With the rapid development of semiconductor process technology, in order to improve the speed and performance of the device, the dimension of the entire circuit device is continuously reduced, and the degree of integration of the device is continuously improved. Generally, as semiconductors tend to shrink the design of circuit devices, the channel region lengths of transistors also tend to be gradually shortened to speed up the operation of the device. However, it is easy to cause serious leakage current, short channel effect and drop of turn-on current in the transistor.

In order to overcome the above problems, multiple gate structures have been proposed in the industry in recent years, which use gates to sandwich the channel region, so that the entire channel region is affected by the gate electric field, thereby increasing the turn-on current of the device and reducing the leakage current. A fin-type field effect transistor (FinFET) is a common transistor with multiple gate structures. However, due to the special manufacturing process of the FinFET, when integrating with the buried planar transistor, the manufacturing process is quite difficult and some problems will be encountered.

SUMMARY

The present disclosure provides a semiconductor device and a method of fabricating the same, which may reduce the difficulty in the process of integrating a FinFET with an embedded planar transistor.

A semiconductor device according to some embodiments of the present disclosure includes the substrate, a plurality of planar transistors, a FinFET and a first nonactive structure. The substrate includes a first region and a second region. The first region includes a plurality of first planar active regions and a nonactive region. The nonactive region is located between or around the plurality of first planar active regions and includes the second planar active region. The second region has a fin active region. The plurality of planar transistors are located on the plurality of first planar active regions in the first region. The FinFET is located on the fin active region in the second region. The first nonactive structure is located in the nonactive region between the plurality of planar transistors.

A method of fabricating a semiconductor device according to some embodiments of the present disclosure includes arranging a nonactive structure between a first device and a second device. When the first device and the second device are respectively planar transistors, the first device and the second device are disposed on the substrate with a first planar active region. The nonactive structure is disposed on the substrate with a second planar active region.

Based on the above, the semiconductor device and the method of fabricating the same according to the embodiments of the present disclosure may reduce the difficulty in the process of integrating the fin-type field effect transistor with the embedded planar transistor.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3A to FIG. 5E show top views and cross-sectional views of various nonactive structures according to embodiments of the present disclosure.

FIG. 7 and FIG. 8 show cross-sectional views of several semiconductor devices according to embodiments of the present disclosure.

FIG. 9A to FIG. 9G show schematic cross-sectional views illustrating a method of fabricating a semiconductor device according to an embodiment of the present disclosure.

DESCRIPTION OF THE EMBODIMENTS

In the embodiment of the present disclosure, when the buried planar field effect transistor is integrated into the fin-type field effect transistor process, a nonactive structure is provided in a sparse region between the plurality of planar field effect transistors to reduce the difficulty of the process.

Figure 1A:
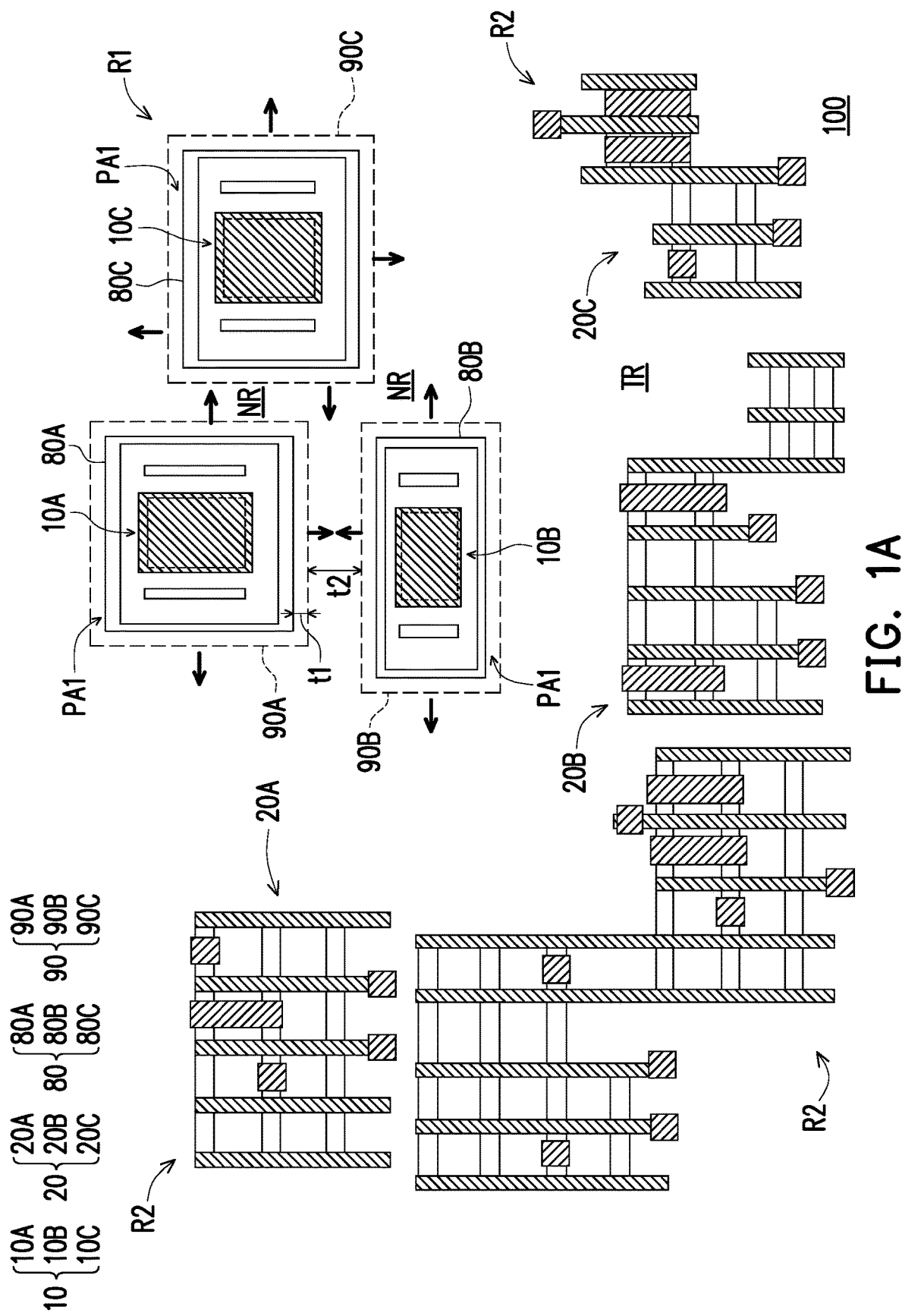
FIG. 1A to FIG. 1C show top views of a method of fabricating a semiconductor device according to an embodiment of the present disclosure.
Figure 1B:
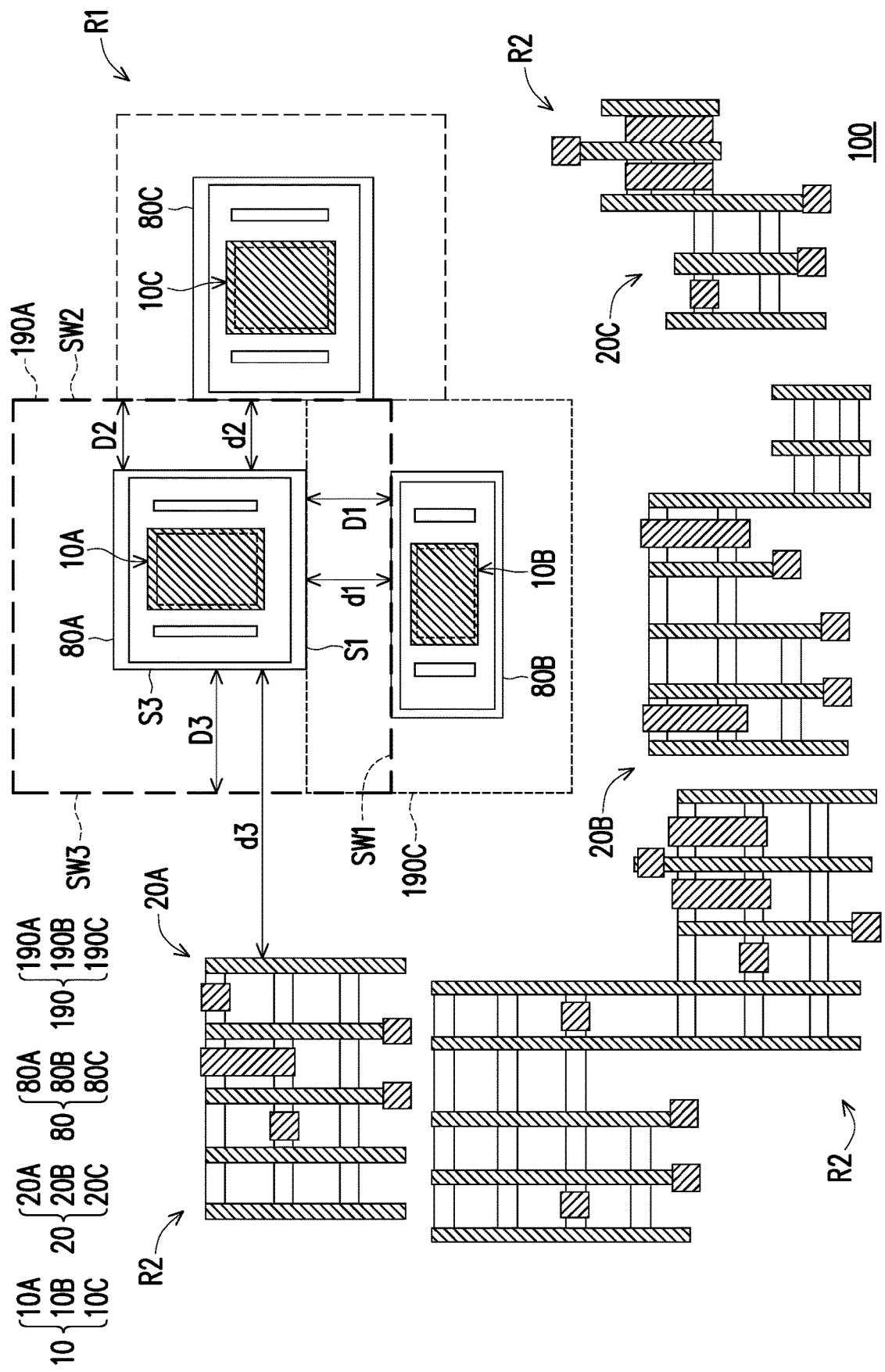
Figure 1C:
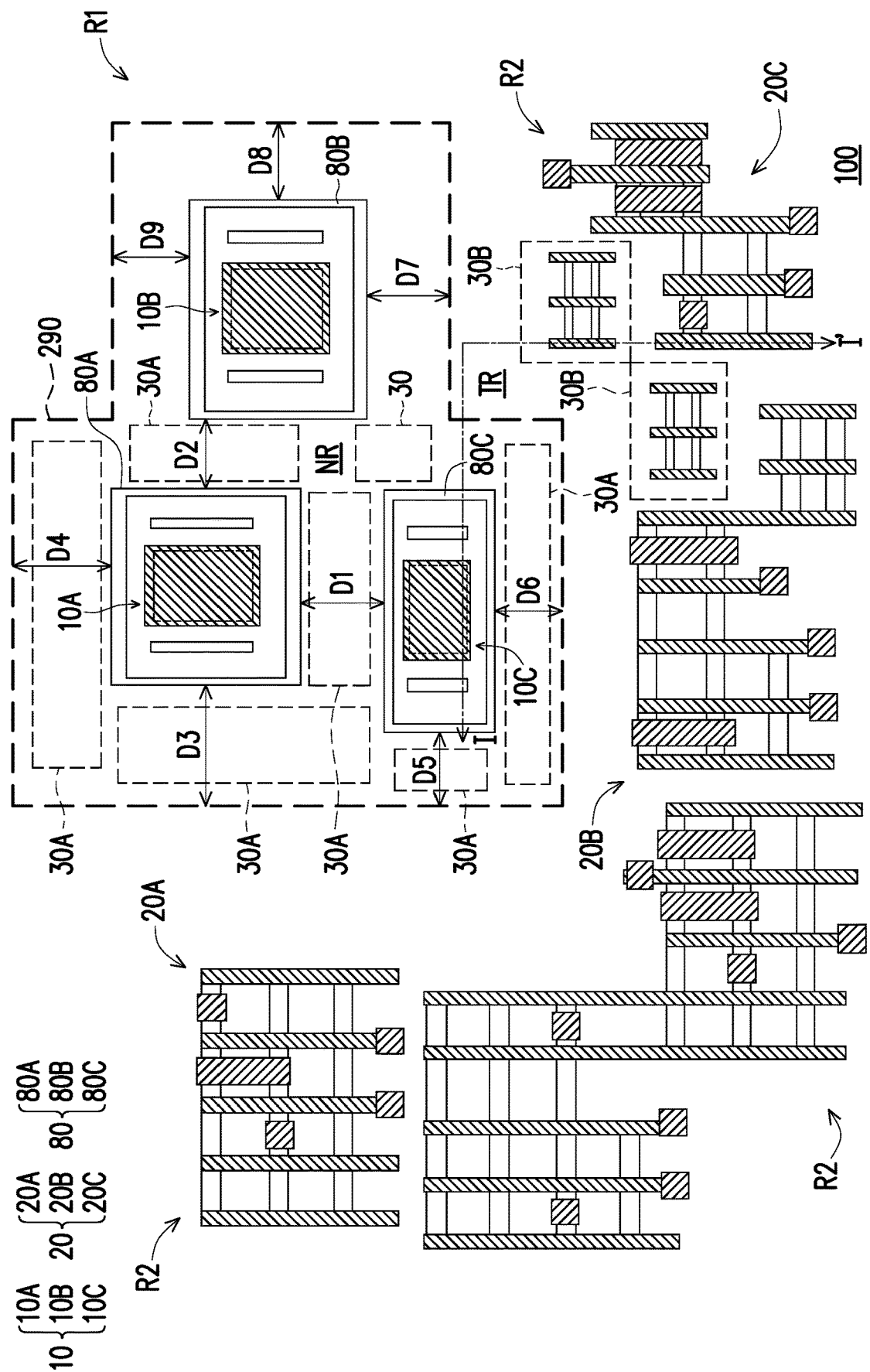
Figure 2:
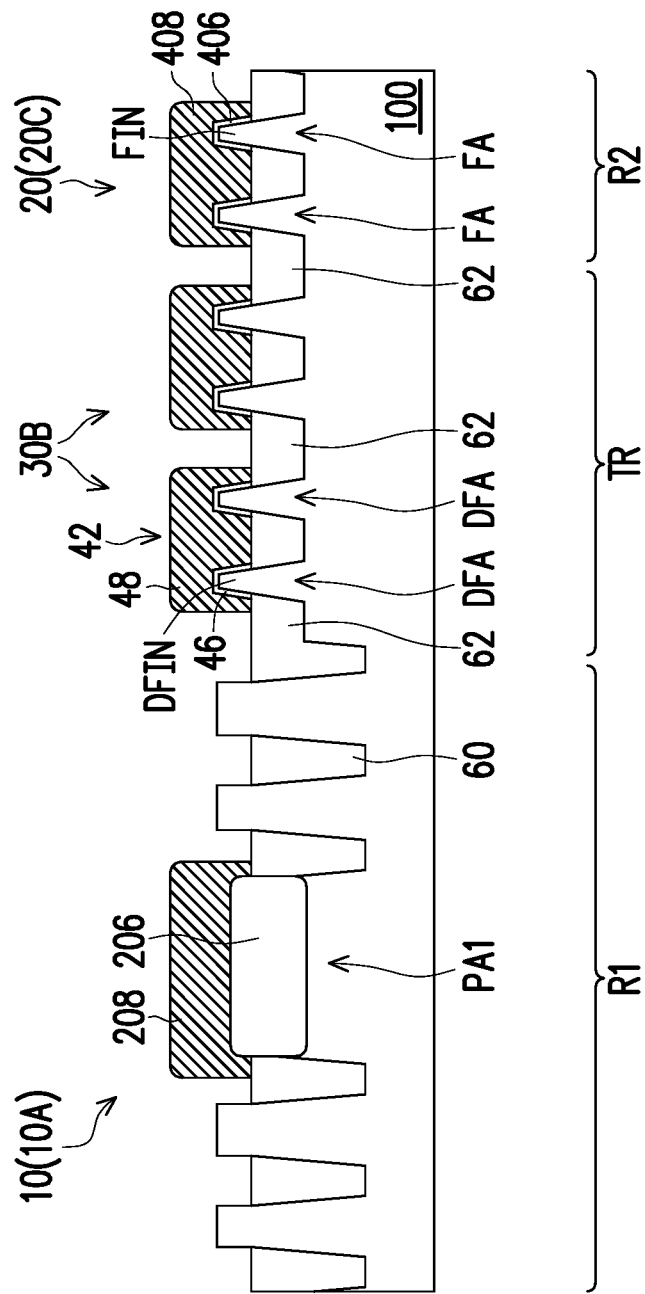
FIG. 2 shows a cross-sectional view along line I-I' of FIG. 1C.

FIG. 1A to FIG. 1C show top views of a method of fabricating a semiconductor device according to an embodiment of the present disclosure. FIG. 2 show a cross-sectional view along line I-I' of FIG. 1C.

Referring to FIG. 1A, a semiconductor device includes a plurality of planar field effect transistors 10 (e.g., planar field effect transistors 10A, 10B, and 10C) and a plurality of fin-type field effect transistors 20 (e.g., fin-type field effect transistors 20A, 20B, and 20C) according to an embodiment of the present disclosure. The plurality of planar field effect transistors 10 and the plurality of fin-type field effect transistors 20 are formed on a substrate 100. The substrate 100 includes a first region R1 and a second region R2. The second region R2 is around the first region R1. The first region R1 includes a plurality of first planar active regions PA1 and a plurality of nonactive regions NR. The planar field effect transistors 10 are formed in the plurality of first planar active regions PA1 of the first region R1. The fin-type field effect transistors 20 are formed in the active region of the second region R2 of the substrate 100. The substrate 100 is, for example, a semiconductor substrate, such as a silicon substrate.

FIG. 7 and FIG. 8 show cross-sectional views of several semiconductor devices according to embodiments of the present disclosure.

FIGS. 2, 7 and 8, a plurality of planar field effect transistors 10 are formed in the plurality of first planar active regions PA1 of the first region R1. The plurality of first planar active regions PA1 are regions defined by the isolation structure 60, and top surfaces of the substrate 100 in the first planar active regions PA1 are substantially flat. The plurality of planar field effect transistors are, for example, high voltage devices 200 (as shown in FIG. 2, FIG. 7 and FIG. 8), or medium voltage devices 300 (as shown in FIG. 8). The high voltage device 200 is, for example, a field effect transistor with an operating voltage ranging from 15 volts to 100 volts. The medium voltage device 300 is, for example, a field effect transistor with an operating voltage of 5 volts to 15 volts.

Referring to FIG. 1A, in some embodiments, a periphery of the planar field effect transistor 10 (e.g., a high voltage device) is surrounded by a guard ring 80 (e.g., 80A, 80B, 80C), so that the planar field effect transistor 10 is within the guard ring 80. The guard ring 80 includes a conductive material such as polysilicon, copper, aluminum and/or tungsten.

Referring to FIG. 2, a plurality of fin-type field effect transistors 20 are formed in the fin active region FA of the second region R2. The fin active region FA is the region defined by the isolation structure 62, and the substrate 100 in the fin active region FA includes fins FIN. The fins FIN protrude from the top surface of the isolation structure 62. In addition, if an intermediate region TR adjacent to the fin-type field effect transistor 20 (such as the fin-type field effect transistor 20B) in the second region R2 is a sparse region, the embodiment of the present disclosure also forms at least a second nonactive structure 30B in the intermediate region TR, as shown in FIG. 1C and FIG. 2.

Referring to FIG. 1C and FIG. 2, the second nonactive structure 30B is, for example, a dummy fin-type field effect transistor. The dummy fin-type field effect transistor is formed in a dummy fin active region DFA. The dummy fin active region DFA is a region defined by the isolation structure 62, and the substrate 100 in the dummy fin active region DFA includes the dummy fin DFIN. The dummy fin DFIN protrudes from the top surface of the isolation structure 62. The dummy fin-type field effect transistor may include a dummy gate structure 42. The dummy gate structure 42 may include a dummy gate conductive layer 48 and a dummy gate dielectric layer 46. The gate conductive layer 48 is, for example, polysilicon. The dummy gate dielectric layer 46 is, for example, silicon oxide.

Referring to FIG. 1A, a nonactive region NR is further included among the plurality of first planar active regions PA1 of the first region R1. The nonactive region NR is a region between or around multiple first planar active regions PA1, which may be a sub-region, a sparse region, a dummy region or a transition region in the first region R1, so the nonactive region NR can also be referred to as a sub-region, a sparse region, a dummy region or a transition region.

Referring to FIG. 1A, according to device design rules, the location and area of some specific devices (e.g., high voltage device or medium voltage device) are identified, and these specific devices are marked with a mark 90. For example, a region including some planar field effect transistors 10 and the guard ring 80 is marked by a mark 90.

According to the design rules, the distance t1 between the mark 90 and guard ring 80 is non-zero. Generally, when the distance t2 between the marks 90 is smaller than a specific value, the nonactive region NR between the marks 90 (for example, marks 90A, 90B, 90C) is not provided with any component. However, in some embodiments, the areas of these nonactive regions NR are quite large, and without any components are formed thereon. The area of the chip is not be effectively utilized. Further, the structure of the planar field effect transistors 10 are quite different from that of the fin-type field effect transistor 20, especially when multiple planar field effect transistors 10 are high voltage device 200 (as shown in FIGS. 2, 7 and 8) or medium voltage device 300 (as shown in FIG. 8), due to the dimension of these devices larger, and a thickness of the gate dielectric layer 206 or 306 is larger, which is greatly different from a dimension of the fin-type field effect transistor 20 and a thickness of the gate dielectric layer 406. Therefore, if the nonactive region NR is not provided with any component therein, it is easy to cause process difficulties. To this end, in the embodiment of the present disclosure, a mark 290 is provided between adjacent first planar active regions PA1, and a first nonactive structure 30A is provided in the portion nonactive region NR within the region enclosed by the mark 290, as shown in FIG. 1C and FIG. 3A to FIG. 5B. The mark 290 may cover a plurality of regions of the first planar active region PA1, and the method for defining the mark 290 will be described later.

FIG. 1C, in some embodiments, the first nonactive structures 30A is disposed within the region enclosed by the mark 290, a space between the planar field effect transistor 10A and 10B, between the planar field effect transistor 10A and 10C, and between the planar field effect transistor 10A and fin-type field effect transistor 20A and/or between the planar field effect transistor 10B and the fin-type field effect transistor 20B.

FIG. 1C, in other some embodiments, the planar field effect transistors 10A, 10B, and 10C are surrounded by guard rings 80A, 80B, and 80C. The first nonactive structures 30A may be disposed between the guard ring 80A and the guard ring 80B, and between the guard ring 80A and the guard ring 80C, and/or between the guard ring 80B and the fin-type field effect transistor 20B. Details about the range of the region enclosed by the mark 290 and whether to provide first nonactive structure 30A in the nonactive region NR are as follows.

Referring to FIG. 1B, the method for defining the region enclosed by the mark 290 includes expanding a plurality of adjacent marks 90 (e.g., marks 90A, 90B, 90C) to a specific range to form a plurality of marks 190 (e.g., marks 190A, 190B, 190C).

Referring to FIG. 1A and FIG. 1B, in some embodiments, a maximum distance that the mark 90 in the first region R1 may expand is a distance between two adjacent guard rings 80. The maximum distance of the mark 90 between the first region R1 and the second region R2 that may be expanded is ½ of the distance between the guard ring 80 and the adjacent fin-type field effect transistor 20. Referring to FIG. 1B, for example, a mark 90A may expand outward to form mark 190A. A distance D1 between the side SW1 of the mark 190A and an opposite sidewall S1 of the guard ring 80A is equal to a distance d1. A distance D2 between the side SW2 of the mark 190A and an opposite sidewall S2 of the guard ring 80A is equal to a distance d2. A distance D3 between a side SW3 of the mark 190A and an opposite sidewall S3 of the guard ring 80A is equal to a distance d3/2. The distance d1 is a distance between the two opposing sidewalls of the guard ring 80A and the guard ring 80B. The distance d2 is a distance between the two opposing sidewalls of the guard ring 80A and the guard ring 80C. The distance d3 is a distance between the sidewall of the guard ring 80A and the adjacent fin-type field effect transistor 20A. In this manner, the mark 90B may be expanded outward to form a mark 190B. The mark 90C may be expanded outward to form a mark 190C.

Referring to FIG. 1C, peripheries of marks 190A, 190B, and 190C are taken to form the mark 290. The mark 290 indicates a region including a plurality of adjacent planar field effect transistors 10 (e.g., 10A, 10B, 10C).

Referring to FIG. 1C, in the embodiment of the present disclosure, the first nonactive structure 30A may be disposed in a portion of the nonactive region NR within the region enclosed by the mark 290. Whether to provide the first nonactive structure 30A in the nonactive region NR may be determined according to the design rules. For example, when a dimension of the nonactive region NR within the mark 190 (i.e., distance D1~D9) reaches a specific range, the first nonactive structure 30A may be disposed in the nonactive region NR. When the dimension of the nonactive region NR within mark 190 (i.e., distance D1~D9) is less than a specific range, the first nonactive structure 30A is not provided in this nonactive region NR.

Referring to FIG. 1C, in some embodiments, a first nonactive structure 30A may be disposed between the guard ring 80A and the guard ring 80B, between the guard ring 80A and the guard ring 80C, the guard ring 80A and the fin-type field effect transistor 20A, and/or between the guard ring 80B and the fin-type field effect transistor 20B within the region enclosed by mark 290.

Referring to FIG. 1C, in other words, the first nonactive structure 30A may not only be disposed between the two planar field effect transistors 10 (for example, between the planar field effect transistors 10A and 10B, or between the planar field effect transistors 10A and 10C), as long as the first nonactive structure 30A is within the region enclosed by the mark 290 and complies with the design rules. The first nonactive structure 30A may also be disposed between the planar field effect transistor 10 and the fin-type field effect transistor 20 (for example, between the planar field effect transistor 10A and the fin-type field effect transistor 20A, or between the planar field effect transistor 10C and the fin-type field effect transistor 20B).

Referring to FIG. 1C, outside the region enclosed by the mark 290, the first nonactive structure 30A is not disposed, but the second nonactive structure 30B is disposed. For example, the second nonactive structure 30B is disposed in the intermediate region TR between the planar field effect transistor 10B and the fin-type field effect transistor 20C, or in the intermediate region TR between the planar field effect transistor 10C and the fin-type field effect transistor 20B.

Referring to FIG. 1C, therefore, only the first nonactive structure 30A, only the second nonactive structure 30B, or both may be disposed between the planar field effect transistor and the fin-type field effect transistor. For example, only the first nonactive structure 30A is disposed between the planar field effect transistor 10A and the fin-type field effect transistor 20A, and the second nonactive structure 30B is not disposed there. Only the second nonactive structure 30B is disposed between the planar field effect transistor 10B and the fin-type field effect transistor 20C, and the first nonactive structure 30A is not disposed there. The first nonactive structure 30A and the second nonactive structure 30B are disposed between the planar field effect transistor 10C and the fin-type field effect transistor 20B. The first nonactive structure 30A and the first nonactive structure 30B are very different in structure, as shown in FIG. 3A to FIG. 5E.

FIG. 3A to FIG. 5E show top views and cross-sectional views of various nonactive structures according to embodiments of the present disclosure. FIG. 3A, FIG. 4A, and FIG. 5A show top views of FIG. 3B, FIG. 4B, and FIG. 5B, respectively. FIG. 3D, FIG. 4D, and FIG. 5D show top views of FIG. 3E, FIG. 4E, and FIG. 5E, respectively.

Referring to FIG. 3B, the first nonactive structure 30A may include one or more dummy gate structures 32 (as shown in FIG. 3B), passive devices, or a combination thereof. The passive devices are, for example, capacitors, inductors, and the like. In some embodiments, the dummy gate structure 32 (e.g., the dummy gate structure 32C) may include a dummy gate conductive layer 38 and a dummy gate dielectric layer 36. The dummy gate conductive layer 38 is, for example, polysilicon. The dummy gate dielectric layer 36 is, for example, silicon oxide. In some embodiments, both sides of the dummy gate structure 32 may further include dummy doped regions (not shown). The nonactive region NR where the first nonactive structure 30A is located is different from the intermediate region TR where the second nonactive structure 30B is located. The nonactive region NR may include the second planar active region PA2 and the isolation structure 60, as shown in FIG. 3A to FIG. 5E.

Referring to FIG. 3A to FIG. 5B, the nonactive region NR may include a second planar active region PA2 and an isolation structure 60. The second planar active region PA2 is defined by isolation structure 60. Referring to FIG. 2, a depth of the isolation structure 60 is different from a depth of the isolation structure 62. In some embodiments, the depth of isolation structure 60 is deeper than the depth of isolation structure 62. The top surface of the substrate 100 in the second planar active region PA2 is substantially flat, while the second nonactive structure 30B is disposed in the dummy fin active region DFA, and the dummy fin DFIN of the dummy fin active region DFA protrudes from a top surface of the isolation structure 62.

FIG. 3A, FIG. 3B, FIG. 4A, and FIG. 4B, in some embodiments, the dummy gate structures 32A, 32B, 32D are located on the second planar active region PA2 and extend to the isolation structure 60. In other embodiments, referring to FIG. 3A to FIG. 5B, the dummy gate structures 32C, 32E and 32F are adjacent to the second planar active region PA2 and on the isolation structure 60 around the second planar active region PA2 without spanning the second planar active region PA2. In addition, the second planar active region PA2 may be spanned by two dummy gate structures 32A and 32B, as shown in FIG. 3A and FIG. 3B. The second planar active region PA2 may be spanned by a single dummy gate structure 32D, as shown in FIG. 4A and FIG. 4B. The second planar active region PA2 may not be spanned by any dummy gate structure 32D, as shown in FIG. 5A and FIG. 5B. The extension directions of the dummy gate structures 32A to 32F in the nonactive region NR may be the same or different. Furthermore, the shapes, dimensions, lengths or areas of the dummy gate structures 32A to 32F in the nonactive region NR may be the same or different.

FIG. 3A to FIG. 5B, various dummy gate structures 32A to 32F, the second planar active region PA2 and the isolation structure 60 may be combined into various groups according to the process. For example, the dummy gate structures 32A to 32C, the second planar active region PA2 and the isolation structure 60 of FIG. 3A and FIG. 3B may form a group G1. The dummy gate structures 32D to 32E, the second planar active region PA2 and the isolation structure 60 of FIGS. 4A and 4B may form a group G2. The dummy gate structure 32F, the second planar active region PA2 and the isolation structure 60 of FIGS. 5A and 5B may form a group G3. The groups G1, G2 and G3 may be combined by themselves or with each other.

For example, in FIG. 3C, the first nonactive structure 30A is formed by two identical groups G1 vertically juxtaposed with each other to form a group G1'. In FIG. 4C, the first nonactive structure 30A includes three identical groups G2 vertically juxtaposed with each other to form a group G2'. In FIG. 5C, the first nonactive structure 30A includes three identical groups G3 vertically juxtaposed with each other to form a group G3'.

Figure 6A:
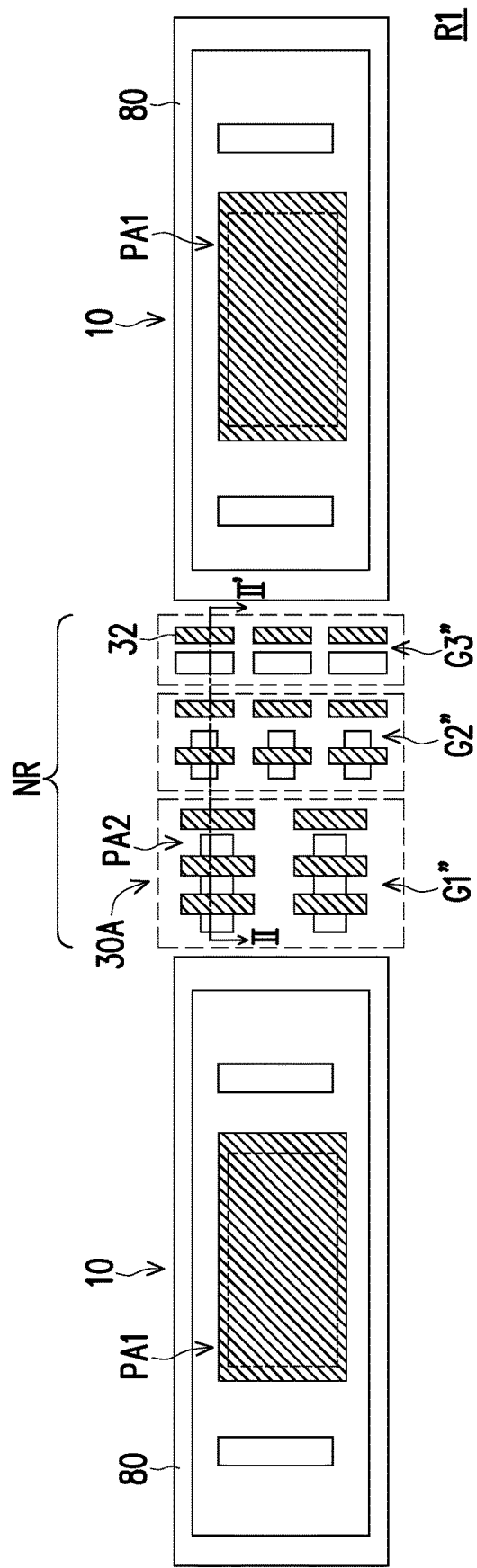
FIG. 6A shows a top view of a semiconductor device according to an embodiment of the present disclosure.
Figure 6B:
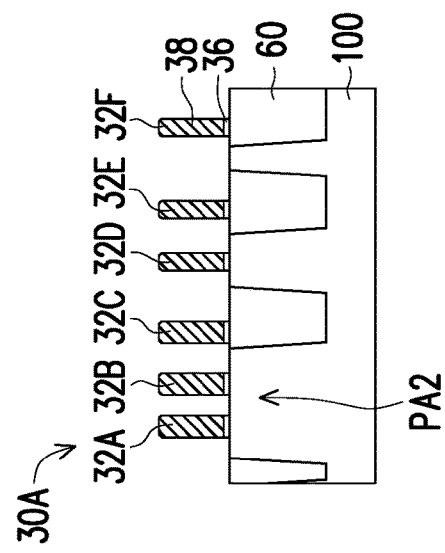
FIG. 6B shows a cross-sectional view of line II-II' of FIG. 6A.

In FIG. 5D and FIG. 5E, the first nonactive structure 30A is formed by two identical groups G3 side by side laterally to form a group G3". In FIG. 3D and FIG. 3E, the first nonactive structure 30A is formed by two identical group G1 and the dummy gate structures 32C belonging to the group G1 side by side laterally to form a group G1". In FIG. 4D and FIG. 4E, the first nonactive structure 30A is formed by two groups G2 and the dummy gate structures 32E in the group G2 side by side laterally to form a group G2". In FIG. 6A and FIG. 6B, the first nonactive structure 30A is formed by group G1', G2' and group G3' side by side laterally.

FIG. 6A shows a top view of a semiconductor device according to an embodiment of the present disclosure. FIG. 6B shows a cross-sectional view of line II-II' of FIG. 6A.

Referring to FIG. 6A, the plurality of planar field effect transistors 10 on both sides of or around the first nonactive structure 30A may be the same or different. Referring to FIG. 7, the plurality of planar field effect transistors 10 on both sides of the first nonactive structure 30A are high voltage devices 200. Referring to FIG. 8, the plurality of planar field effect transistors 10 on both sides of the first nonactive structure 30A are a medium voltage device 300 and a high voltage device 200.

Referring to FIG. 7, the high voltage device 200 is, for example, a first field effect transistor T1. The first field effect transistor T1 is located in the first active region AR1 of the multiple first planar active regions PA1. The first field effect transistor T1 includes a first doped region 202, a doped region 204, a first gate structure 210 and a first portion 60A of the isolation structure 60. The first doped region 202 and the second doped region 204 are located in the substrate 100. The first gate structure 210 is located on the substrate 100 between the first doped region 202 and the second doped region 204. The first gate structure 210 includes a first gate conductive layer 208 and a first gate dielectric layer 206. The first gate conductive layer 208 is located on the substrate 100. The first gate dielectric layer 206 is located between the first gate conductive layer 208 and the substrate 100. The first gate dielectric layer 206 is, for example, silicon oxide. The first gate conductive layer 208 is, for example, doped polysilicon. The first doped region 202 and the second doped region 204 may have N-type dopant (e.g., phosphorus or arsenic) or P-type dopant (e.g., boron) therein. The first portion 60A of the isolation structure 60 is located between the first doped region 202 and the gate dielectric layer 206, and between the second doped region 204 and the gate dielectric layer 206.

Referring to FIG. 7, in some embodiments, the high voltage device 200 further includes pick up regions 212 and 214. The pick up regions 212 and 214 are respectively around the first doped region 202 and the second doped region 204 and are spaced apart from the first doped region 202 and the second doped region 204 by another portion 60C of the isolation structure 60. The pick up regions 212 and 214 may have N-type dopant (e.g., phosphorus or arsenic) or P-type dopant (e.g., boron) therein.

Referring to FIG. 8, the medium voltage device 300 is, for example, a second field effect transistor T2. The second field effect transistor T2 is located in the second active region AR2 of the plurality of first planar active regions PAL The second field effect transistor T2 includes a third doped region 302, a fourth doped region 304, a second gate structure 310 and a second portion 60B of the isolation structure 60. The third doped region 302 and the fourth doped region 304 are located in the substrate 100. The second gate structure 310 is located on the substrate 100 between the third doped region 302 and the fourth doped region 304. The second gate structure 310 includes a second gate conductive layer 308 and a second gate dielectric layer 306. The second gate conductive layer 308 is located over the substrate 100. The second gate dielectric layer 306 is located between the second gate conductive layer 308 and the substrate 100. The second gate dielectric layer 306 is, for example, silicon oxide. The second gate conductive layer 308 is, for example, doped polysilicon. The third doped region 302 and the fourth doped region 304 may have N-type dopant (e.g., phosphorus or arsenic) or P-type dopant (e.g., boron) therein.

Referring to FIG. 8, in some embodiments, the medium voltage device 300 further includes pick up regions 312 and 314. The pick up regions 312 and 314 are respectively around the third doped region 302 and the fourth doped region 304 and are spaced apart from the third doped region 302 and the fourth doped region 404 by the second portion 60B of the isolation structure 60. The pick up regions 312 and 314 may have N-type dopant (e.g., phosphorus or arsenic) or P-type dopant (e.g., boron) therein.

FIG. 9A to FIG. 9G show schematic cross-sectional views illustrating a method of fabricating a semiconductor device according to an embodiment of the present disclosure.

Figure 9A:
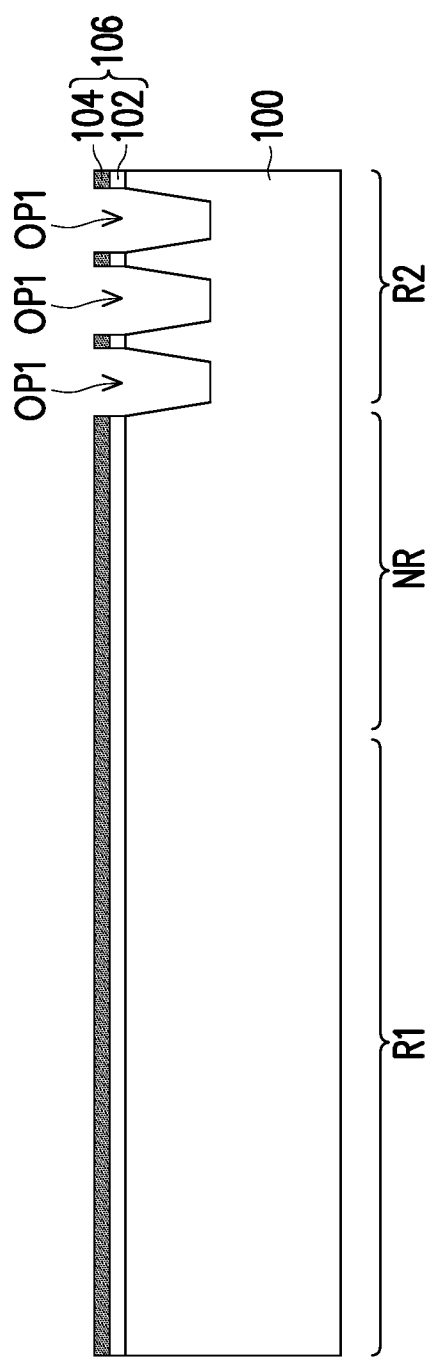

Referring to FIG. 9A, a substrate 100 is provided. The substrate 100 is, for example, a semiconductor substrate, such as a silicon substrate. Next, a plurality of trenches OP1 are formed in a second region R2 of the substrate 100. The plurality of trenches OP1 may be formed by forming a mask layer 106 on the substrate 100, and then performing an etching process by using the mask layer 106 as a hard mask to form the plurality of trenches OP1. The mask layer 106 includes, for example, the silicon oxide layer 102 and the silicon nitride layer 104.

Figure 9B:
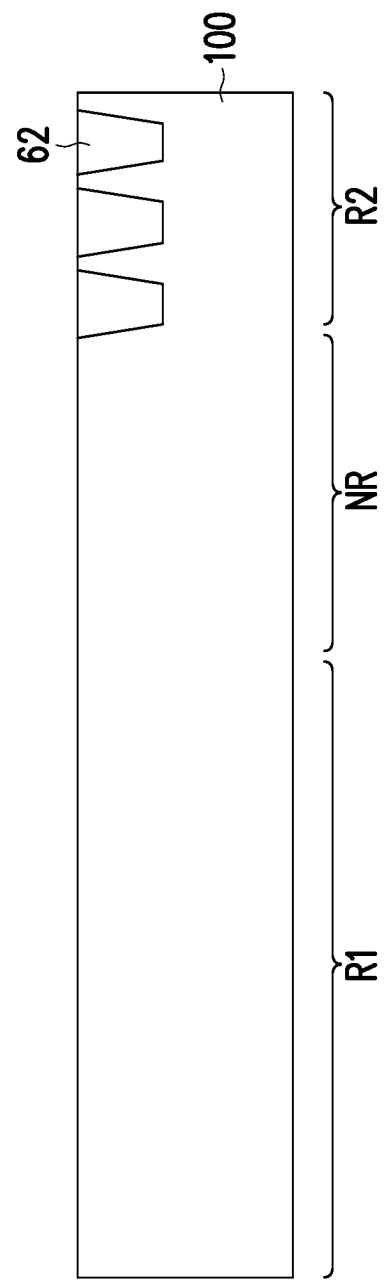

Referring to FIG. 9B, next, an isolation structure 62 is formed in each trench OP1. The material of the isolation structure 62 is, for example, silicon oxide, silicon nitride, or a combination thereof. The isolation structure 62 may be formed with insulating material on the substrate 100 and in the plurality of trenches OP1, and then planarized through a chemical mechanical polishing process. After that, the mask layer 106 is removed.

Referring to FIG. 9C, a plurality of trenches OP2 are formed in a first region R1 and a nonactive region NR of the substrate 100. The plurality of trenches OP2 may be formed in a method similar to, but not limited to, the plurality of trenches OP1. A depth of plurality of trenches OP2 is deeper than a depth of the plurality of trenches OP1 (FIG. 9A).

Referring to FIG. 9D, an isolation structure 60 is formed in each trench OP2. The material and formation method of the isolation structure 60 may be similar to those of the isolation structure 62. The isolation structure 60 defines a plurality of first planar active regions PA1 in the first region R1, and defines a plurality of second planar active regions PA2 in the nonactive region NR.

Figure 9E:
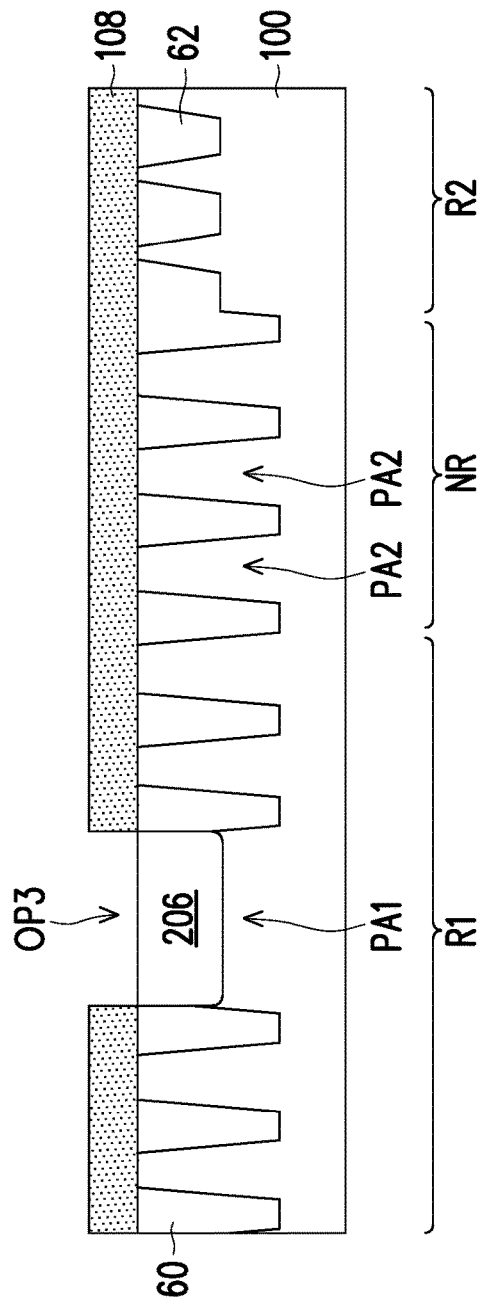

Referring to FIG. 9E, a mask layer 108 is formed on the substrate 100. The mask layer 108 covers the nonactive region NR and the second region R2. The opening OP3 of the mask layer 108 exposes the surface of a portion of the substrate 100 in the first region R1. Next, a thermal oxidation process is performed to form a gate dielectric layer 206 on the substrate 100 exposed by the opening OP3. The material of the gate dielectric layer 206 is, for example, silicon oxide.

Figure 9F:
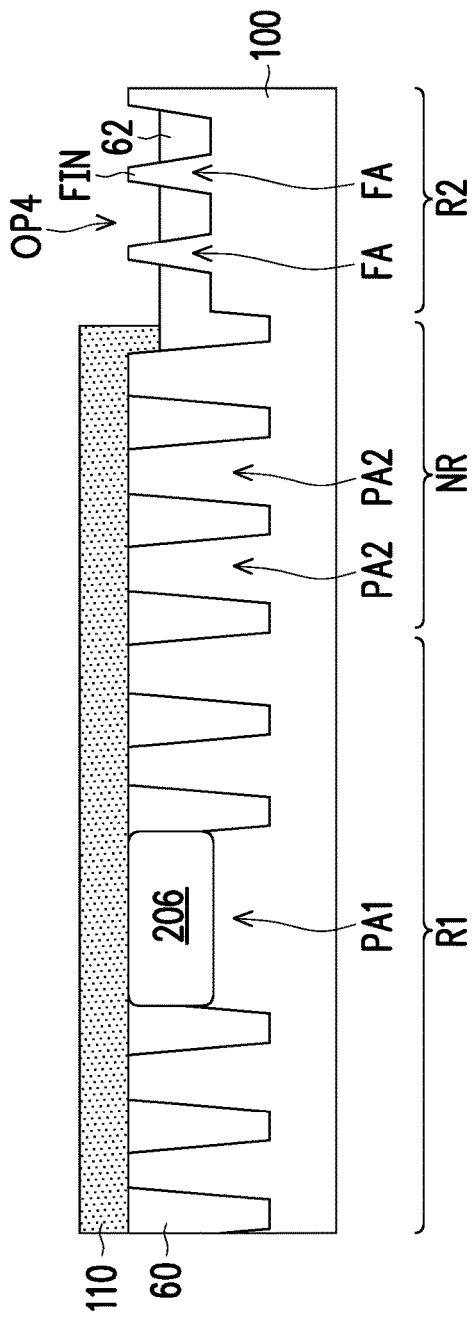

Referring to FIG. 9F, the mask layer 108 is removed. After that, another mask layer 110 is formed on the substrate 100. The mask layer 110 covers the first region R1 and the nonactive region NR. An opening OP4 of the mask layer 110 exposes the substrate 100 and the isolation structure 62 in the second region R2. After that, an etching process is performed to remove a portion of isolation structure 62 exposed by the opening OP4 to form a plurality of fins FIN. The remaining isolation structure 62 defines a plurality of fin active regions FA.

Figure 9G:
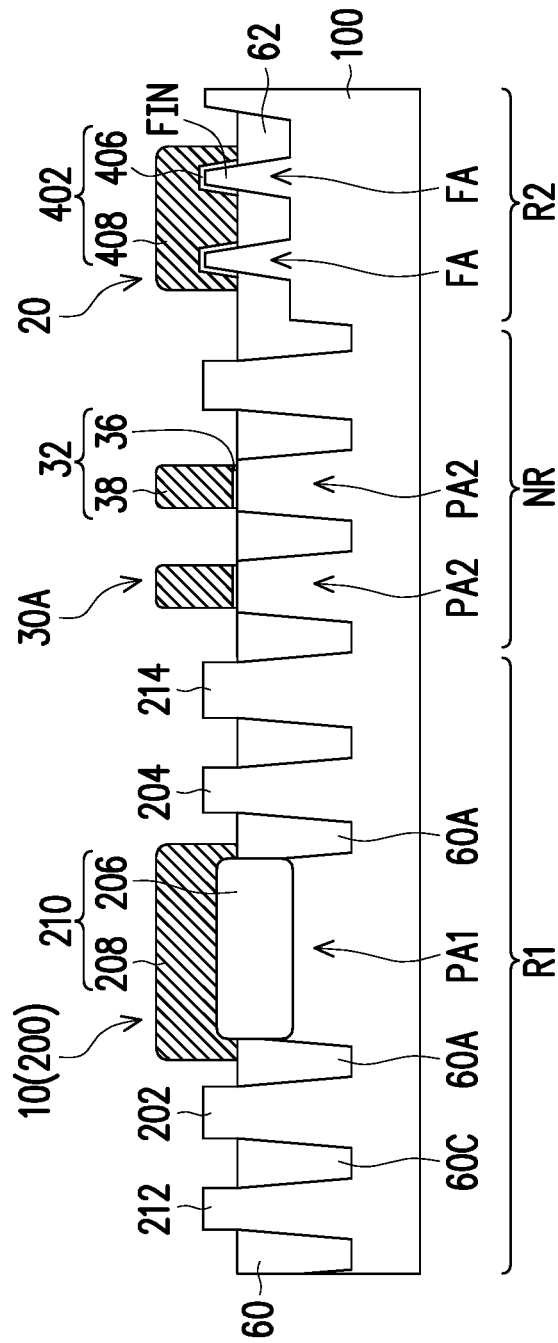

Referring to FIG. 9G, the mask layer 110 is removed, and subsequent processes are continued to complete the fabrication of the plurality of planar field effect transistors 10, the first nonactive structure 30A and the plurality of fin-type field effect transistors 20. For example, the first nonactive structure 30A is the dummy gate structure 32. The method of forming the dummy gate structure 32 includes forming the dummy gate structure 32 in the nonactive region NR. The method for forming the dummy gate structure 32 is, for example, forming a gate dielectric material and a gate conductive material on the substrate 100, and then performing lithography and etching processes to form dummy gate dielectric layers 36 and dummy gate conductive layers 38. The dummy gate dielectric layers 36 are, for example, silicon oxide. The dummy gate conductive layers 38 are, for example, polysilicon.

The fin-type field effect transistor 20 includes a gate structure 402 and source and drain regions (not shown). The method for forming the gate structure 402 is, for example, forming a gate dielectric material and a gate conductive material on the substrate 100, and then forming a gate dielectric layer 406 and a gate conductive layer 408 through lithography and etching processes. The gate dielectric layer 406 is, for example, silicon oxide. The gate conductive layer 408 is, for example, polysilicon. After that, an ion implantation process is performed to form a source region and a drain region (not shown) in the plurality of fin active regions FA at both sides of the gate structure 402.

When the planar field effect transistor 10 is a high voltage device 200, the high voltage device 200 includes a first doped region 202, a second doped region 204, a first gate structure 210, pick up regions 212 and 214, and the first portion 60A and another portion 60C of the isolation structure 60.

A method for forming the high voltage device 200 is, for example, after forming a gate dielectric layer 206 on the substrate 100, forming a gate conductive material on the substrate 100, and then performing a lithography and etching process to form a gate conductive layer 208. The gate conductive layer 208 is, for example, polysilicon. The gate dielectric layer 206 and the gate conductive layer 208 form a gate structure 210. After that, an ion implantation process is performed to form the first doped region 202, the second doped region 204, and the pick up regions 212 and 214 in the first planar active region PA1 on both sides of the gate structure 210.

In some embodiments, dummy gate dielectric layer 36 and gate dielectric layer 406 may be formed simultaneously. The dummy gate conductive layer 38, the gate conductive layers 408 and 208 may be formed at the same time. However, the embodiments of the present disclosure are not limited thereto.

To sum up, the present disclosure integrates a plurality of marks that indicate a plurality of adjacent embedded planar field effect transistors into a single mark, and disposes non-active devices in a nonactive region within the region enclosed by the mark. The non-active devices are disposed on the substrate in or around the planar active region. Compared with the fin-shaped active regions with sharp undulating contours in which the fin-type field effect transistors are arranged, the planar active regions in where the non-active devices are arranged are similar to the planar active regions in which the planar device are arranged and around the non-active devices. Therefore, the manufacturing process difficulty may be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:
a substrate, comprising:
a first region, including:
a plurality of first planar active regions; and
a nonactive region between or around the plurality of first planar active regions, wherein the nonactive region comprises a second planar active region; and
a second region comprising a fin active region;
a plurality of planar transistors located on the plurality of first planar active regions in the first region;
a fin-type field effect transistor on the fin active region in the second region; and
a first nonactive structure located in the nonactive region between the plurality of planar transistors.

2. The semiconductor device of claim 1, wherein the first nonactive structure comprises at least a dummy gate structure, a passive device, or a combination thereof.

3. The semiconductor device of claim 2, wherein the at least one dummy gate structure comprises a plurality of dummy gate structures having different areas.

4. The semiconductor device of claim 2, wherein the at least one dummy gate structure includes a plurality of dummy gate structures having the same area.

5. The semiconductor device of claim 2, wherein the at least one dummy gate structure is located on the second planar active region.

6. The semiconductor device of claim 2, wherein the at least one dummy gate structure is located adjacent to the second planar active region and located on an isolation structure around the second planar active region.

7. The semiconductor device of claim 1, wherein the plurality of planar transistors comprise a first transistor located in a first active region of the plurality of first planar active regions, and the first transistor comprises:
a first doped region, located in the substrate;
a second doped region, located in the substrate;
a first gate structure, located between the first doped region and the second doped region, wherein the first gate structure comprises:
a first gate conductive layer on the substrate; and a first gate dielectric layer located between the first gate conductive layer and the substrate; and an isolation structure, comprising:

a first portion located between the first doped region and the gate dielectric layer, and between the second doped region and the gate dielectric layer.

8. The semiconductor device of claim 7, further comprising:

a plurality of guard rings located in the first region, wherein each of the plurality of planar transistors is located in the corresponding guard ring.

9. The semiconductor device of claim 8, wherein a first guard ring of the plurality of guard rings is located in the first active region.

10. The semiconductor device according to claim 9, wherein the first portion of the isolation structure is further located between the first doped region and the first guard ring, between the second doped region and the first guard ring, and between the gate dielectric layer and the first guard between rings.

11. The semiconductor device of claim 7, wherein the plurality of planar transistors comprise a second transistor located in a second active region of the plurality of first planar active regions, and the second transistor comprises:

a third doped region, located in the substrate;

a fourth doped region, located in the substrate;

a second gate structure, located between the third doped region and the fourth doped region, wherein the second gate structure comprises:

a second gate conductive layer, over the substrate; and a second gate dielectric layer, located between the second gate conductive layer and the substrate;

an isolation structure further comprising:

a second portion, around the second active region.

12. The semiconductor device of claim 11, wherein a thickness of the first gate dielectric layer is greater than a thickness of the second gate dielectric layer.

13. The semiconductor device of claim 11, wherein a second guard ring of the plurality of guard rings is located in the second active region.

14. The semiconductor device of claim 13, wherein the second portion of the isolation structure is further located between the third doped region and the second guard ring, between the fourth doped region and the first guard ring, and between the second gate dielectric layer and the second guard ring.

15. The semiconductor device of claim 13, wherein the at least one nonactive structure is located between the first guard ring and the second guard ring.

16. The semiconductor device of claim 8, wherein the at least one nonactive structure is located between the plurality of guard rings.

17. The semiconductor device according to claim 7, further comprising:

a second nonactive structure located in the non-active fin active region, wherein the non-active fin active region is located in an intermediate region between the first region and the second region.

* * * * *